United States Patent
Okano

(10) Patent No.: US 7,843,703 B2
(45) Date of Patent: Nov. 30, 2010

(54) MULTILAYER PRINTED CIRCUIT BOARD

(75) Inventor: Motochika Okano, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/350,117

(22) Filed: Jan. 7, 2009

(65) Prior Publication Data

US 2009/0296362 A1 Dec. 3, 2009

(30) Foreign Application Priority Data

Jun. 2, 2008 (JP) .............................. 2008-145181

(51) Int. Cl.
*H05K 1/11* (2006.01)
*H05K 1/14* (2006.01)

(52) U.S. Cl. ..................... 361/795; 361/760; 361/792; 361/794

(58) Field of Classification Search ......... 361/736–737, 361/760–765, 792–795; 336/199–200; 257/531–535
See application file for complete search history.

(56) References Cited

U.S. PATENT DOCUMENTS

| | | | |
|---|---|---|---|
| 6,549,112 B1 * | 4/2003 | Gallina et al. | 336/200 |
| 6,759,937 B2 * | 7/2004 | Kyriazidou | 336/200 |
| 7,375,609 B2 * | 5/2008 | Suzuki et al. | 336/200 |

FOREIGN PATENT DOCUMENTS

| | | | |
|---|---|---|---|
| JP | 03-106097 | 5/1991 | |
| JP | 07-19325 | 3/1995 | |
| JP | 2001-077538 | 3/2001 | |
| JP | 2004-022735 | 1/2004 | |
| JP | 2005-085966 | * 3/2005 | ............... 3/60 |
| JP | 2005-340733 | 12/2005 | |
| WO | WO 2006/137248 | 12/2006 | |

OTHER PUBLICATIONS

Japanese Patent Application No. 2008-145181 Notice of Reasons for Rejection mailed Mar. 24, 2009 (English translation).

* cited by examiner

*Primary Examiner*—Tuan T Dinh
(74) *Attorney, Agent, or Firm*—Blakely, Sokoloff, Taylor & Zafman LLP

(57) ABSTRACT

According to one embodiment, a multilayer printed circuit board having a plurality of wiring layers and an electronic component mounted thereon, includes a spiral wire including a path in a substantial spiral shape configured with a printed wire section of a substantial loop shape provided on each of at least two wiring layers of the plurality of wiring layers, and a plug provided on each wiring layer arranged between a top wiring layer which is a wiring layer on a top on which the printed wire section of a substantial loop shape is provided and a bottom wiring layer which is a wiring layer on a bottom on which the printed wire section of a substantial loop shape is provided.

3 Claims, 3 Drawing Sheets

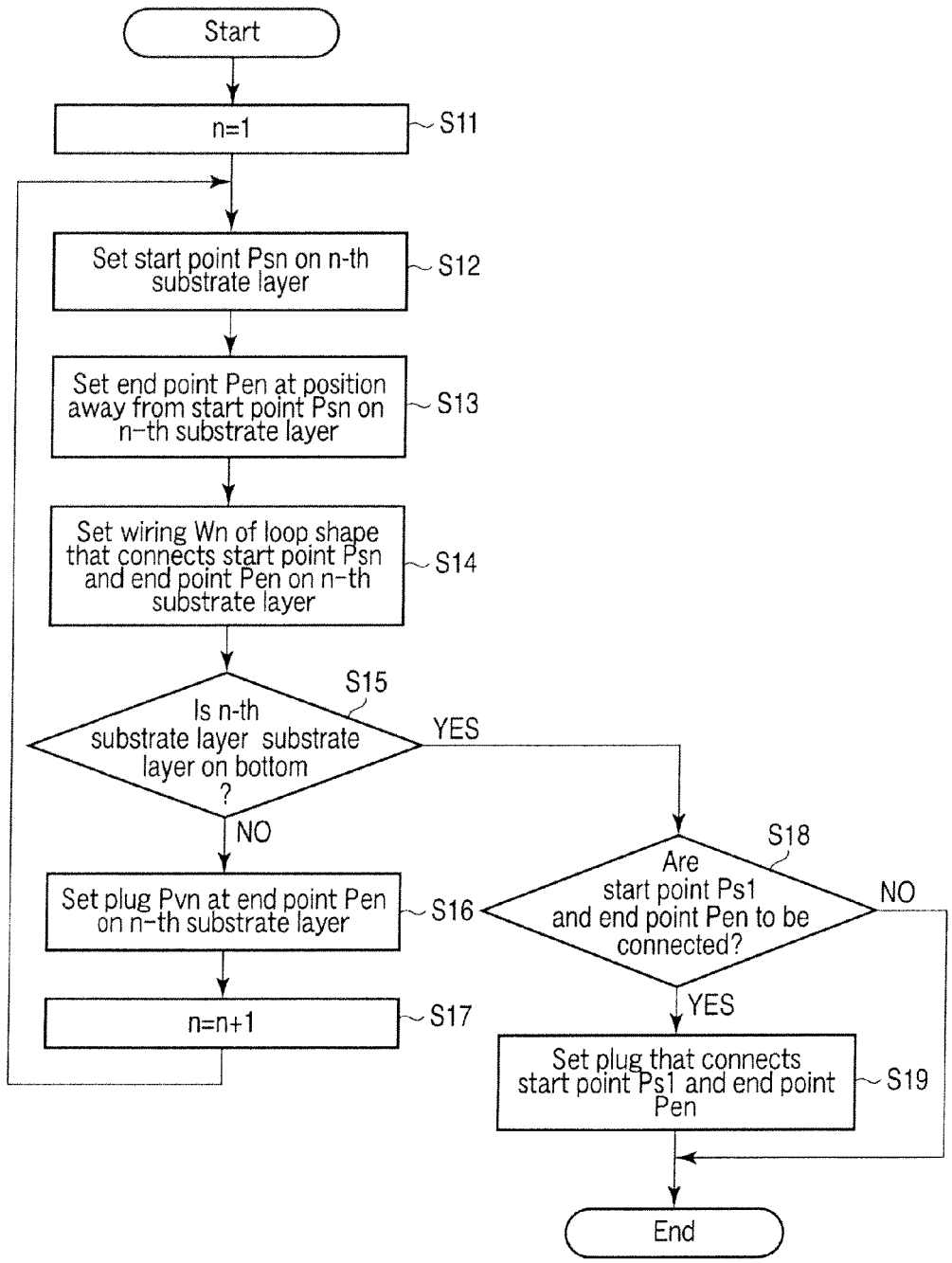
F I G. 4

MULTILAYER PRINTED CIRCUIT BOARD

CROSS-REFERENCE TO RELATED APPLICATIONS

This application is based upon and claims the benefit of priority from Japanese Patent Application No. 2008-145181, filed Jun. 2, 2008, the entire contents of which are incorporated herein by reference.

BACKGROUND

1. Field

One embodiment of the present invention relates to a multilayer printed circuit board that restricts EMI, and a design method of a multilayer printed circuit board.

2. Description of the Related Art

When an IC mounted on a printed circuit board operates, EMI is emitted from the IC and wiring connected to the IC. When a magnitude of EMI is larger than a certain value (for CISPR regulation [10 m method], 30 dBµV/m in a frequency range up to 230 MHz, and 37 dBµV/m in a frequency range of 230 MHz to 1 GHz), EMI is over the standard, and products cannot be shipped.

In order to restrict EMI, there has been disclosed a technique of providing a ground pattern around a multilayer printed circuit board so that ground surfaces in different layers are connected with each other (Jpn. Pat. Appln. KOKAI Publication No. 2005-340733).

In recent years, an amount of generated EMI tends to be large, and development of a technique of restricting EMI has been desired.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary flowchart for explaining a design method of the multilayer printed circuit board according to one embodiment of the present invention.

DETAILED DESCRIPTION

Various embodiments according to the invention will be described hereinafter with reference to the accompanying drawings. In general, according to one embodiment of the invention, a multilayer printed circuit board having a plurality of wiring layers and an electronic component mounted thereon, comprises a spiral wire including a path in a substantial spiral shape configured with a printed wire section of a substantial loop shape provided on each of at least two wiring layers of the plurality of wiring layers, and a plug provided on each wiring layer arranged between a top wiring layer which is a wiring layer on a top on which the printed wire section of a substantial loop shape is provided and a bottom wiring layer which is a wiring layer on a bottom on which the printed wire section of a substantial loop shape is provided.

Figure 1:
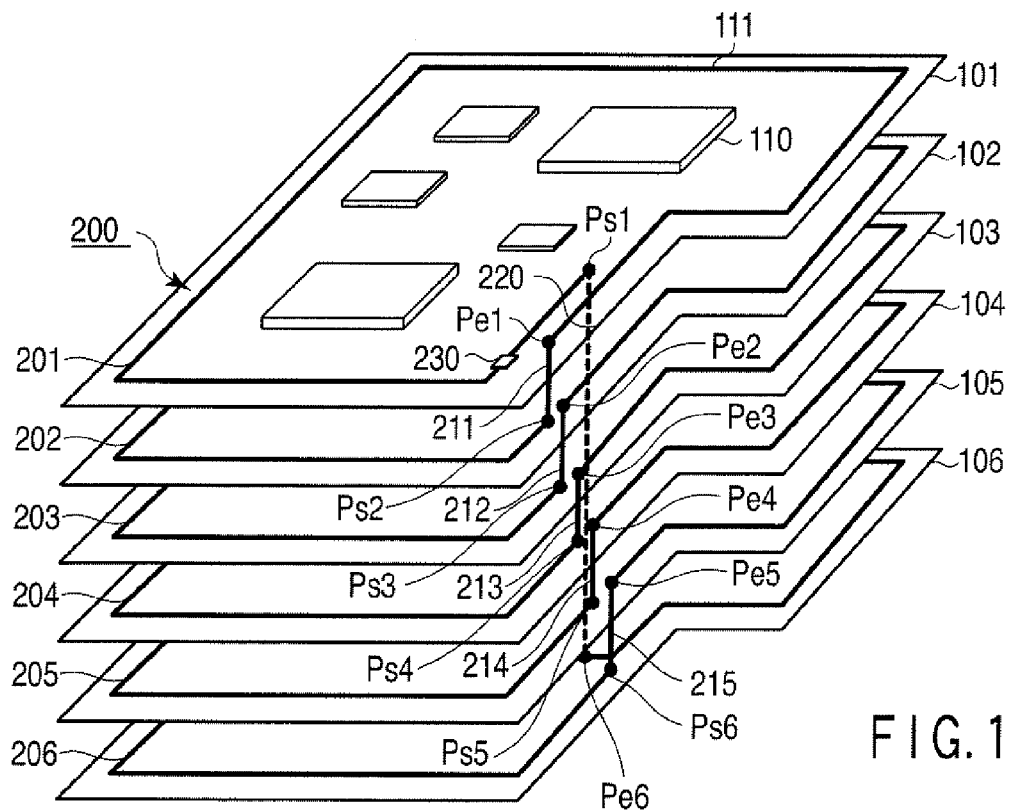
FIG. 1 is an exemplary perspective view showing a configuration of a multilayer printed circuit board according to one embodiment of the present invention.

FIG. 1 is a perspective view showing an outline of a multilayer printed circuit board according to one embodiment of the present invention.

As shown in FIG. 1, this multilayer printed circuit board is configured with six layers of substrates, a first wiring layer to a sixth wiring layer, laminated in this order from the top. Illustration of an insulating material between each of the wiring layers is omitted.

Electronic components 110, such as an IC, are mounted on a first wiring layer 101. Wiring (not shown) that connects the electronic components is provided on a front surface of the first wiring layer 101. In addition, a via plug (not shown) and a through-hole plug (not shown) for connecting wiring between the wiring layers are provided. On the first wiring layer 101 to the sixth wiring layer 106, an EMI restriction wiring 200 that is formed in a unicursal manner is provided. The EMI restriction wiring 200 is wired along the circumference of each of the wiring layers 101 to 106, and also is formed in a spiral shape.

The EMI restriction wiring 200 includes printed wires 201 to 206 in a loop shape that are formed on the wiring layers 101 to 106, respectively. Also, the printed wires 201 to 206 in a loop shape include start points Ps1 to Ps6, and end points Pe1 to Pe6, respectively. The EMI restriction wiring 200 includes a plug 211, a plug 212, a plug 213, a plug 214, a plug 215, and a plug 220. The plug 211 connects the end point Pe1 provided on the first wiring layer 101 and the start point Ps2 provided on the second wiring layer 102. The plug 212 connects the end point Pe2 provided on the second wiring layer 102 and the start point Ps3 provided on the third wiring layer 103. The plug 213 connects the end point Pe3 provided on the third wiring layer 103 and the start point Ps4 provided on the fourth wiring layer 104. The plug 214 connects the end point Pe4 provided on the fourth wiring layer 104 and the start point Ps5 provided on the fifth wiring layer 105. The plug 215 connects the end point Pe5 provided on the fifth wiring layer 105 and the start point Ps6 provided on the sixth wiring layer 106. The plug 220 connects the end point Pe6 provided on the sixth wiring layer 106 and the start point Ps1 provided on the first wiring layer 101. The EMI restriction wiring 200 may have a configuration that does not include the plug 220. The plugs 211 to 215 are configured with via plugs. Also, the plug 220 may be configured with a through-hole plug, or a plurality of via plugs.

The EMI restriction wiring 200 can be drawn in a unicursal manner from the start point Ps1 as a basic point to the end point Pe1 through the plurality of wires 201 to 206, the plugs 211 to 215, and 220.

The EMI restriction wiring 200 restricts EMI emitted from the multilayer printed circuit board by using the inertia of an electromagnetic field. That is, in general, when a magnetic field passes through a coil, an electric current for generating a magnetic field that cancels the magnetic field flows through the coil. The EMI restriction wiring 200 that is wired in a spiral manner can function as a coil.

Figure 2:
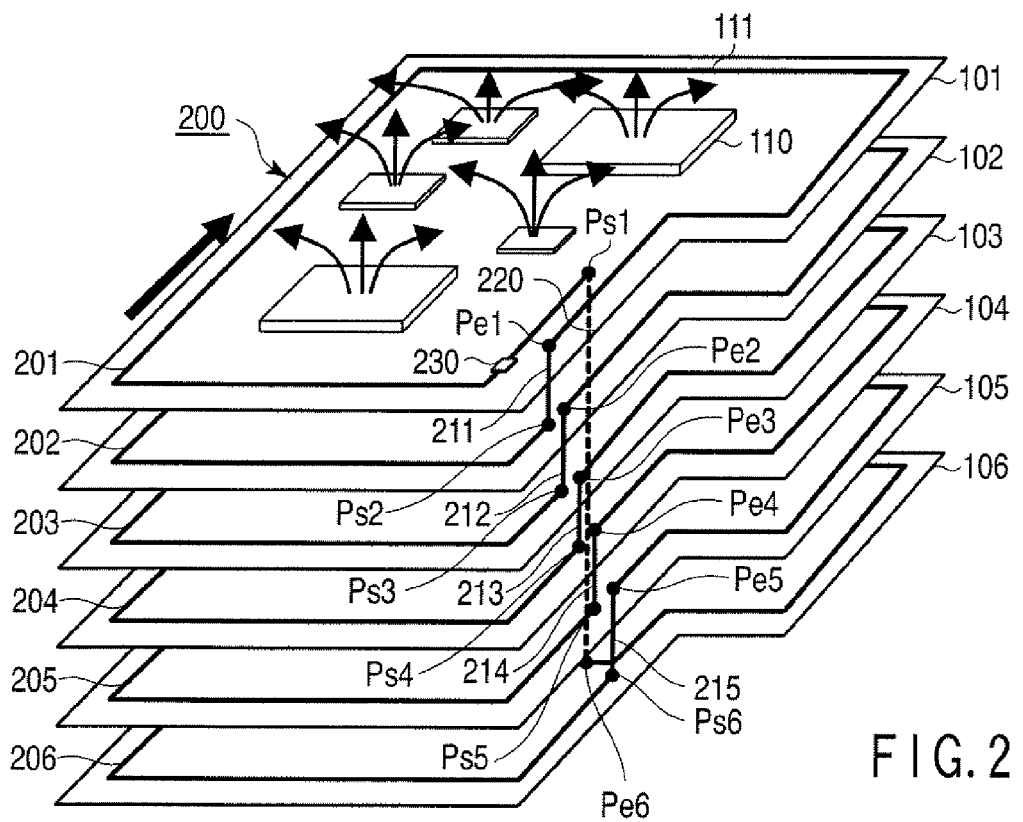
FIG. 2 is an exemplary view for explaining an advantageous effect of the multilayer printed circuit board shown in FIG. 1.

When EMI is generated at the time the multilayer printed circuit board operates, an electric current for restricting a magnetic field flows through the EMI restriction wiring 200 (in a direction of an arrow along the EMI restriction wiring 200 in FIG. 2). A magnetic field generated by this electric current restricts a magnitude of EMI.

A resistance element 230 is desirably inserted at some midpoint of the printed wire 201 that constitutes the EMI restriction wiring 200. The resistance element 230 converts energy of EMI into thermal energy. In this manner, an effect of restricting EMI can be improved.

A coil has a larger electromotive force, that is, a larger generated magnetic field, as the number of turns increases. Accordingly, the printed wires 201 to 206 in a loop shape constituting the EMI restriction wiring 200 are desirably wired along the circumference of all the wiring layers of the first wiring layer 101 to the sixth wiring layer 106. Printed wires in a loop shape, however, may be formed on two or more selected wiring layers as part of the wiring layers.

Figure 3:
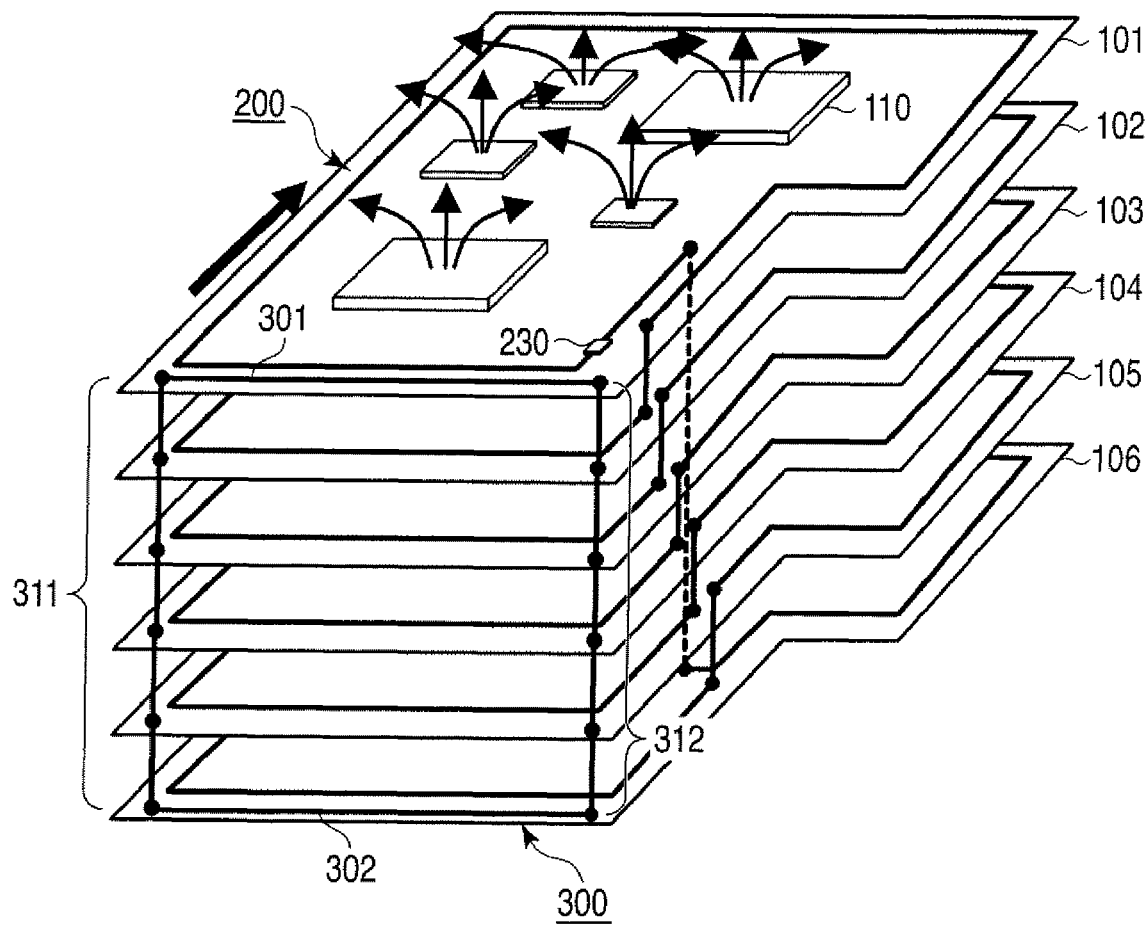
FIG. 3 is an exemplary perspective view showing a configuration of a modification example of the multilayer printed circuit board shown in FIG. 1.

In addition, as shown in FIG. 3, a parallel EMI restriction wiring 300 in a loop shape configured with a printed wire 301, a plug 311, a printed wire 302, and a plug 312 may be provided. The printed wire 301 is wired along one side of the first wiring layer 101. The plug 311 is connected to a first end of the printed wire. The printed wire 302 is connected to the plug 311 on a first end and arranged along a side of the sixth wiring layer 106 along a side on which the printed wire 301 is provided. The plug 312 connects a second end of the printed wire 301 and a second end of the printed wire 302. The parallel EMI restriction wiring 300 can restrict EMI emitted in parallel with the multilayer printed circuit board. The plugs 311 and 312 may be configured with a plurality of via plugs, or a through-hole plug.

Next, description will be made with respect to design of the multilayer printed circuit board having EMI restriction wiring by a multilayer printed circuit board design device, with reference to FIG. 4. FIG. 4 is a flowchart for explaining a design method of the multilayer printed circuit board according to one embodiment of the present invention.

In addition, when the multilayer printed circuit board is designed, data in which a mounting position of an electronic component and a wiring pattern are designed is first prepared. Whether wiring is formed along the circumference of a wiring layer or formed on the circumference of an electronic component is set, and such setting is input to the design device.

The number 1 is substituted into n (Block S11). Next, a start point Psn is set on an n-th wiring layer (Block S12). When a plug that connects the first wiring layer and a bottom wiring layer is formed, the start point Ps1 on the first wiring layer is desirably set at a position that does not overlap wiring on all of the lower wiring layers.

Next, an end point Pen is set at a position away from the start position Psn (Block S13). When the end point Pen is set, the end point Pen is set at a position that does not overlap wiring on lower wiring layers. In addition, when an end point of a bottom wiring layer is set, the end point is desirably set at a position that overlaps the start point Ps1 on the first wiring layer on the top.

A wire Wn in a loop shape that connects the start point Psn and the end point Pen is automatically arranged on the n-th wiring layer (Block S14). At this time, the wire Wn is arranged so that the wire Wn does not overlap other printed wires and a mounting position of an electronic component on the same layer.

Next, whether or not the n-th wiring layer is a wiring layer on the bottom of the multilayer printed circuit board is determined (Block S15). When the n-th wiring layer is determined to be not the bottom layer (NO on Block S15), a plug Pvn is set at the end point Pen on the n-th wiring layer (Block 316). Then, n is incremented by one (Block S17). Then, by sequentially executing processing from Block S12, plugs that connect a wire in a loop shape and wires formed on vertically and horizontally adjacent wiring layers can be arranged.

When the n-th wiring layer is determined to be the bottom wiring layer in Block S15 (YES in Block S15), whether or not a plug that connects the start point Ps1 on the first wiring layer and the end point Pen on the n-th wiring layer on the bottom will be set is determined (Block S18). In order to carry out the above determination, an operator provides in advance information of whether a plug is to be set or not to the multilayer printed circuit board design device as setting.

Next, when the plug is determined to be not set (NO in Block S18), the design processing ends. When the plug is determined to be set (YES in Block S18), the first end point of the first wiring layer is set at a position away from the first start point. A pattern of a substantial loop shape which is part of an EMI restriction wire is set in such a manner as connecting the first start point and the first end point. A via plug is set at one of the start point and the end point. A plug that connects the start point Ps1 on the first wiring layer and the end point Pen on the n-th wiring layer on the bottom is set (Block S19).

In the processing described above, the multilayer printed circuit board having EMI restriction wiring of a spiral shape can be set. With respect to a wiring layer on which a printed wire of a loop shape is not arranged, plugs that are connected with printed wires or plugs of upper and lower wiring layers are automatically arranged.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multilayer printed circuit board having a plurality of wiring layers and an electronic component mounted thereon, comprising:

a spiral wire including a unicursal path in a substantial spiral shape configured with a printed wire section of a substantial loop shape provided on each of at least two wiring layers of the plurality of wiring layers and provided along a circumference of the wiring layer, a first plug provided on each wiring layer arranged between a top wiring layer which is a wiring layer on a top on which the printed wire section of a substantial loop shape is provided and a bottom wiring layer which is a wiring layer on a bottom on which the printed wire section of a substantial loop shape is provided, and a second plug that connects the printed wire section of a loop shape on the top wiring layer directly to the printed wiring layer of a loop shape on the bottom wiring layer; and a resistance element which is inserted in the printed wire section of a substantial loop shape.

2. The multilayer printed circuit board of claim 1, further comprising:

a loop wire including a path of a loop shape having a first printed wire section provided along one side of a wiring layer selected from the plurality of wiring layers, a second printed wire section provided along one side of a wiring layer lower than the selected wiring layer, a third plug configured to connect a one end side of the first printed wire section and a one end side of the second printed wire section, and a fourth plug configured to connect the other end side of the first printed wire section and the other end side of the second printed wire section.

3. The multilayer printed circuit board of claim 1, wherein as the multilayer printed circuit board operates, an electric current for restricting a magnetic field flows through the spiral wire to generate a magnetic field that lessens the amount of electromagnetic interference (EMI).

* * * * *